US008717025B2

(12) United States Patent
Weng

(10) Patent No.: US 8,717,025 B2
(45) Date of Patent: May 6, 2014

(54) METHOD AND SYSTEM FOR ECHO PLANAR IMAGING WITH SLICE SELECTION ALSO OCCURRING CONCURRENTLY WITH PHASE ENCODING, DURING READOUT

(75) Inventor: De He Weng, Shenzhen (CN)

(73) Assignee: Siemens Aktiengesellschaft, Munich (DE)

( * ) Notice: Subject to any disclaimer, the term of this patent is extended or adjusted under 35 U.S.C. 154(b) by 352 days.

(21) Appl. No.: 12/908,026

(22) Filed: Oct. 20, 2010

(65) Prior Publication Data
US 2011/0181280 A1      Jul. 28, 2011

(30) Foreign Application Priority Data

Jan. 28, 2010   (CN) .......................... 2010 1 0102282

(51) Int. Cl.
*G01R 33/561*    (2006.01)
*G01R 33/565*    (2006.01)

(52) U.S. Cl.
CPC ...... *G01R 33/5616* (2013.01); *G01R 33/56554* (2013.01); *G01R 33/56563* (2013.01); *G01R 33/56536* (2013.01)
USPC ............................ 324/316; 324/307; 324/309

(58) Field of Classification Search
CPC ..................... G01R 33/5616; G01R 33/56554; G01R 33/56536; G01R 33/56563; G01R 33/561; G01R 33/565
USPC .......................... 324/300–322; 600/407–435; 382/128–131
See application file for complete search history.

(56) References Cited

U.S. PATENT DOCUMENTS

| | | | | |
|---|---|---|---|---|
| 4,734,646 A * | 3/1988 | Shenoy et al. | ................ | 324/309 |
| 4,871,966 A * | 10/1989 | Smith et al. | .................. | 324/309 |
| 4,908,578 A * | 3/1990 | Van Liere | ...................... | 324/309 |
| 4,922,202 A * | 5/1990 | Le Roux | ....................... | 324/306 |
| 4,983,917 A * | 1/1991 | Le Roux | ....................... | 324/306 |
| 5,928,146 A * | 7/1999 | Itagaki et al. | ................. | 600/410 |
| 6,066,901 A * | 5/2000 | Burkhart et al. | ............. | 307/106 |
| 6,127,826 A * | 10/2000 | Thompson et al. | ........... | 324/307 |
| 6,275,040 B1 * | 8/2001 | Zur | ............................... | 324/320 |
| 6,320,380 B1 * | 11/2001 | Wu et al. | ....................... | 324/309 |
| 6,614,225 B1 * | 9/2003 | Feinberg | ....................... | 324/307 |
| 6,640,125 B2 * | 10/2003 | Dreher et al. | ................. | 600/410 |
| 6,700,374 B1 * | 3/2004 | Wu et al. | ....................... | 324/312 |

(Continued)

OTHER PUBLICATIONS

"Total Inhomogeneity Correction Including Chemical Shifts and Susceptibility by View Angle Tilting," Cho et al., Medical Physics, vol. 15, No. 1 (1988) pp. 7-10.

(Continued)

*Primary Examiner* — Melissa Koval
*Assistant Examiner* — Tiffany Fetzner
(74) *Attorney, Agent, or Firm* — Schiff Hardin LLP

(57) ABSTRACT

In a method and system for echo planar imaging, after having applied a radiofrequency pulse and a slice selection gradient, continuous readout gradients alternating between positive and negative are applied and a phase encoding gradient is applied before starting each readout gradient. A slice selection gradient is applied at the same time as applying the phase encoding gradient. Scanning signals are collected during the duration of the readout gradients. Image reconstruction is implemented based on the scanning signals to obtain a scanned image.

5 Claims, 4 Drawing Sheets

(56) References Cited

U.S. PATENT DOCUMENTS

| | | | |
|---|---|---|---|
| 6,842,001 B2* | 1/2005 | Ikezaki | 324/309 |
| 6,933,720 B2* | 8/2005 | Zhang | 324/309 |
| 7,375,524 B2* | 5/2008 | Katscher et al. | 324/307 |
| 7,898,254 B2* | 3/2011 | Feinberg et al. | 324/309 |
| 2002/0008515 A1* | 1/2002 | Dreher et al. | 324/309 |
| 2007/0103156 A1* | 5/2007 | Katscher et al. | 324/309 |
| 2009/0012387 A1* | 1/2009 | Hanson et al. | 600/411 |
| 2009/0212773 A1* | 8/2009 | Feinberg et al. | 324/309 |
| 2010/0001727 A1* | 1/2010 | Frydman et al. | 324/310 |
| 2010/0277169 A1* | 11/2010 | Feiweier | 324/307 |
| 2011/0181280 A1* | 7/2011 | Weng | 324/307 |
| 2011/0234223 A1* | 9/2011 | McColl et al. | 324/309 |
| 2012/0013336 A1* | 1/2012 | Hetzer et al. | 324/309 |

OTHER PUBLICATIONS

"Simultaneous Acquisition of Gradient-Echo and Asymmetrical Spin-Echo for Single-Short Z-Shim: Z-SAGA," Heberlein et al., Magnetic Resonance in Medicine, vol. 51 (2004) pp. 212-216.

"Diffusion-Weighted Multiple Shot Echo Planar Imaging of Humans without Navigation," Robson et al., Magnetic Resonance in Medicine, vol. 38 (1997) pp. 82-88.

* cited by examiner

METHOD AND SYSTEM FOR ECHO PLANAR IMAGING WITH SLICE SELECTION ALSO OCCURRING CONCURRENTLY WITH PHASE ENCODING, DURING READOUT

BACKGROUND OF THE INVENTION

1. Field of the Invention

The present invention relates to the field of magnetic resonance (MR) imaging and, particularly, to a method and system for echo planar imaging.

2. Description of the Prior Art

The principles of magnetic resonance imaging (MRI) are that when an external magnetic field is applied, radiofrequency (RF) pulses of a specific frequency are employed to excite the protons in a tissue under examination, the protons absorbing certain energy to resonate; after the RF pulse emission is stopped, the excited protons gradually release the absorbed energy in the form of scanning signals, and a scanned image of the tested tissue can be obtained by collecting the scanning signals and employing an image reconstruction technique to process the scanning signals. It needs to be pointed out that, the basic unit for signal processing is the voxel, a voxel can include one or more protons, and when image reconstruction is carried out, the processed object is the scanning signal collected from each voxel.

In this case, the external magnetic field includes a main (basic) magnetic field and three orthogonal gradient magnetic fields, and in these three fields the direction which is the same as the main magnetic field is generally defined as Z axis direction, and the X axis and Y axis are orthogonal with the Z axis. Specifically, the gradient magnetic field along the direction of the Z axis is referred to as a slice selection (SS) gradient, and, at the same time, the direction of the Z axis is also referred to as the SS direction; the gradient magnetic field along the direction of the Y axis is referred to as the phase encoding (PE) gradient, at the same time, the direction of the Y axis is also referred to as the PE direction; and the gradient magnetic field along the direction of the X axis is referred to as a frequency encoding gradient, which is also referred to as the readout (RO) gradient in practical applications, and the direction of the X axis is also referred to as the RO direction.

With the development of MRI technology, echo planar imaging (EPI) sequences are currently the sequences with the fastest scanning speed, and FIG. 1 is a schematic diagram of an EPI sequence in the prior art. As shown in FIG. 1, a slice selection gradient 101 is applied in the SS direction, then the voxels at different positions in the SS direction have different resonance frequencies; at this moment an RF pulse 102 at an angle of 90° is used to selectively excite the voxels at a certain frequency, and the voxels excited at the certain frequency are in one slice; then a phase encoding gradient 103 is applied in the PE direction, so the voxels at different positions in the PE direction have phase differences; and, at the same time, a readout gradient 104 is applied in the RO direction, then the protons at different positions in the RO direction would attenuate at different frequencies. In this case, the greatest feature of an EPI sequence is that the readout gradients 104 are continuous and alternate between positive and negative; an echo collection, i.e. a collection of scanning signals, is carried out during the period of each readout gradient 104, and a phase encoding gradient 103 is applied before starting each echo collection.

However, in practical applications, since the effects of factors, such as eddy currents, the nonuniformity of the main magnetic field or the nonuniformity of the magnetic susceptibility thereof, etc. would cause the nonuniformity of the magnetic field, the resonance frequency of a voxel would change, and when a frequency encoding and a phase encoding are carried out, errors may occur in the phase of the voxel, which is especially serious during the phase encoding in an EPI sequence; therefore, although an EPI sequence can carry out fast imaging, the image distortions resulting from the nonuniformity of the magnetic field cannot be overcome. For these reasons, a series of improvements have been made on the basis of employing the currently available EPI sequence to carry out a scan, and there are mainly the following improvement methods. Firstly, after having scanned by employing an EPI sequence, re-scanning is carried out by employing a bi-gradient echo sequence, and after this re-scanning has been carried out by employing a bi-gradient echo sequence, the nonuniform field pattern of the magnetic field can be obtained, from which the number of the displaced pixels of each voxel in the scanned image can be deduced, and then the scanned image obtained by the EPI sequence is corrected; secondly, one scan is carried out by employing an EPI sequence on the basis of a phase encoding gradient with positive polarity, and then one scan is carried out by employing an EPI sequence on the basis of a phase encoding gradient with negative polarity, thus two scanned images can be obtained, and in these two images, the directions of the displacements occurring in the phase encoding direction due to the nonuniformity of the magnetic field are opposite, and the number of the displaced pixels of each voxel in the scanned images can be deduced by calculating the integration of the voxel phantom of each voxel in the phase encoding direction in the two scanned images. It needs to be pointed out that, FIG. 1 shows an EPI sequence on the basis of a phase encoding gradient with positive polarity, and, in the EPI sequence on the basis of a phase encoding gradient with negative polarity, the direction of the phase encoding gradient would be opposite to the direction of the phase encoding gradient shown in FIG. 1; thirdly, the effective bandwidth of the phase encoding gradient is increased, in which the effective bandwidth of the phase encoding gradient is in proportion to the reciprocal of the time of each echo collection, while the degree of the image distortion is in inverse proportion to the effective bandwidth in the phase encoding direction. For example, assuming the effective bandwidth of the phase encoding gradient is 10 Hz and the frequency difference (the difference between the actual resonance frequency and the uniform field resonance frequency) due to the nonuniformity of the magnetic field is 20 Hz, then the number of resulting displaced pixels is 20/10=2; and assuming the effective bandwidth of the phase encoding gradient to be increased to 20 Hz and the frequency difference due to the nonuniformity of the magnetic field to stay the same, then the number of resulting displaced pixels is now 20/20=1.

However, there are still defects in the abovementioned three improvement methods: in the first and the second improvement methods the scanning time is increased, and in the first improvement method, when the nonuniformity of the magnetic field is relatively large, there are deviations in shape between the nonuniform field pattern of the magnetic field and the EPI scanned image itself, thus the number of displaced pixels of each proton deduced from the nonuniform field pattern of the magnetic field is inaccurate; while in the second improvement method, the noises of the two scans are different, thus when the integration of each voxel in the phase encoding direction is carried out in the two scanned images, the effects caused by the noise signals are different, so the number of displaced pixels of the proton deduced from the two images is inaccurate; and the third scanning method can be realized in theory, but the maximum of the effective bandwidth in the phase encoding direction is limited by hardware devices such as the gradient system and so on, so the effective bandwidth in the phase encoding direction cannot be increased unlimitedly; therefore it can be seen that none of the three improvement methods can avoid image distortions effectively.

SUMMARY OF THE INVENTION

The present invention provides a method for echo planar imaging, so as to avoid distortions in a scanned image.

The present invention also provides a system for echo planar imaging, so as to avoid distortions in a scanned image.

The above object is achieved in accordance with the invention by a method for echo planar imaging, wherein, after having applied a radiofrequency pulse and a slice selection gradient, continuous readout gradients alternating between positive and negative are applied and a phase encoding gradient is applied before starting each readout gradient. The following steps are then implemented: applying a slice selection gradient at the same time as applying a phase encoding gradient, collecting scanning signals during the duration time of the readout gradients, and carrying out image reconstruction on the basis of said scanning signals to obtain a scanned image.

In an embodiment, the amplitude of the slice selection gradient applied at the same time as applying the phase encoding gradient is equal to the amplitude of the phase encoding gradient.

The method can further include increasing the effective bandwidth of the phase encoding gradient according to the predetermined requirements.

A system for echo planar imaging has a radiofrequency pulse applying unit, a slice selection gradient applying unit, a readout gradient applying unit, a phase encoding gradient applying unit, a collecting unit, and a reconstruction unit.

The radiofrequency pulse applying unit is used for applying a radiofrequency pulse.

The readout gradient applying unit is used for applying continuous readout gradients alternating between positive and negative.

The phase encoding gradient applying unit is used for applying a phase encoding gradient before starting each readout gradient.

The slice selection gradient applying unit is used for applying a slice selection gradient at the same time as applying a phase encoding gradient.

The collecting unit is used for collecting scanning signals during the duration time of the readout gradients.

The reconstruction unit is used for reconstructing an image on the basis of said scanning signals, so as to obtain a scanned image.

The system can further include an effective bandwidth control unit for increasing the effective bandwidth of the phase encoding gradient according to the predetermined requirements.

It can be seen from the abovementioned technical solution that the method and system for echo planar imaging provided by the present invention further apply additional slice selection gradients at the same time as applying phase encoding gradients, so that during the imaging, the inclination of the projection angles of the voxels in the phase encoding direction happens, thus overcoming the problem that errors occur in the phase differences of the voxels due to the nonuniformity of the magnetic field, which can avoid the distortions in the scanned image.

DESCRIPTION OF THE PREFERRED EMBODIMENTS

In order to make the objects, technical solutions and advantages of the present invention more apparent, the present invention will be further described in detail below with reference to the accompanying drawings and embodiments.

Figure 2:
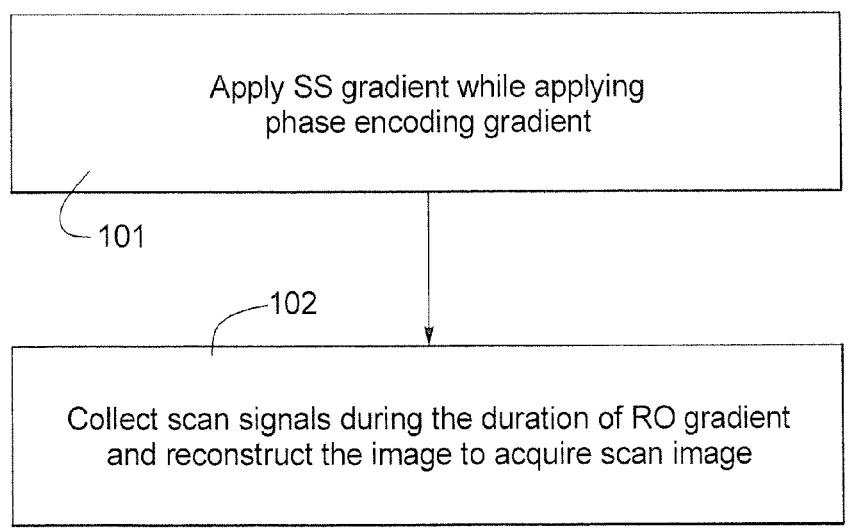
FIG. 2 is a flow chart of a method for echo planar imaging of an embodiment of the present invention.

FIG. 2 is a flow chart of a method for echo planar imaging of an embodiment of the present invention. As shown in FIG. 2, the method further comprises the following steps:

Step 101, applying a slice selection gradient at the same time as applying a phase encoding gradient.

Figure 1:
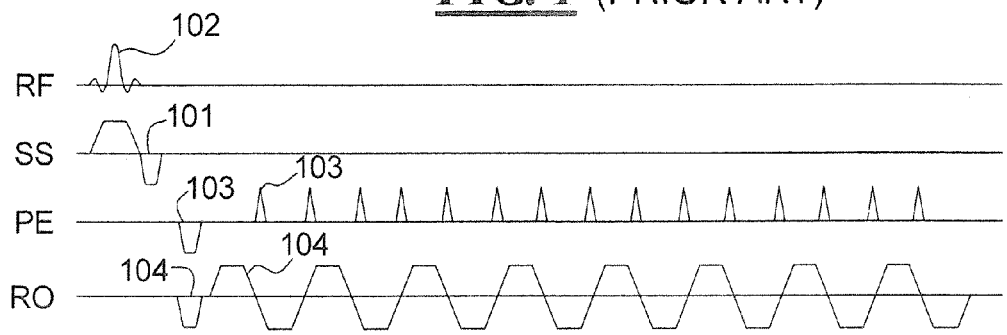
FIG. 1 is a schematic diagram of an EPI sequence in the prior art.
Figure 3A:
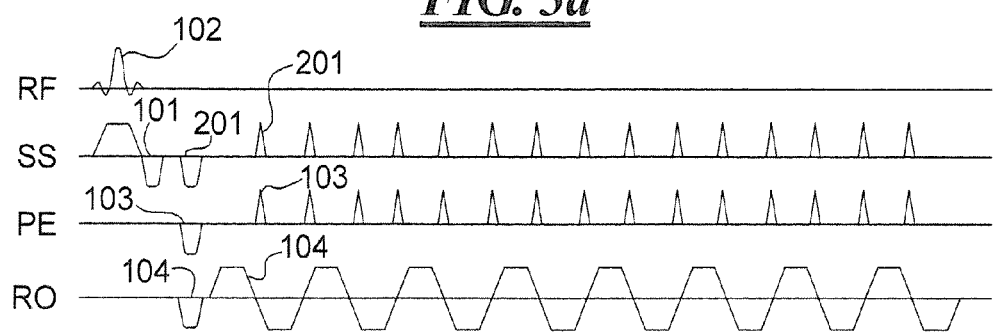
FIG. 3a is a schematic diagram of an embodiment of an EPI sequence provided by the present invention.

FIG. 3a is a schematic diagram of an embodiment of an EPI sequence provided by the present invention. Compared with the EPI sequence in the prior art shown in FIG. 1, in FIG. 3a, an additional slice selection gradient 201 is applied in the SS direction at the same time as applying phase encoding gradient 103; the duration time of the additionally applied slice selection gradient 201 is the same as the duration time of the phase encoding gradient 103, and the amplitude of the additionally applied slice selection gradient 201 can be the same or not the same as the amplitude of the phase encoding gradient 103, in which it is an optimal implementation for the amplitude of the additionally applied slice selection gradients 201 to be equal to the amplitude of the phase encoding gradient 103.

Figure 4A:
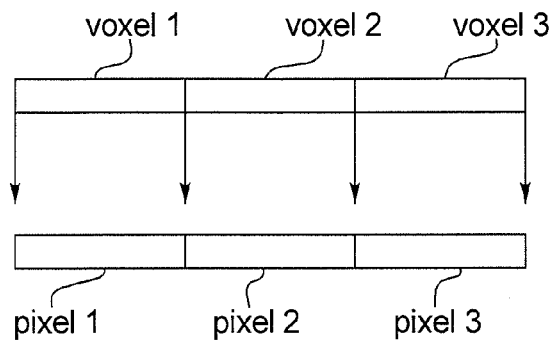
FIG. 4a is a schematic diagram of an imaging by employing an EPI sequence in the prior art under ideal conditions.

FIG. 4a is a schematic diagram of imaging by employing an EPI sequence in the prior art under ideal conditions, which refer to the conditions of a uniform magnetic field. As shown in FIG. 4a, voxels 1, 2 and 3 are three adjacent voxels located in the system under examination, and under the ideal conditions; when applying an RF pulse and after a slice selection gradient in the SS direction has been applied, the excited voxels 1, 2 and 3 are on the same slice, and, after applying a phase encoding gradient in the PE direction, voxels 1, 2 and 3 have different phases, that is to say, voxels at different positions have phase differences. When carrying out the imaging, since the voxels 1, 2 and 3 have different phases, they can be distinguished on the scanned image. In this case, the image of voxel 1 in the scanned image is pixel 1, the image of voxel 2 in the scanned image is pixel 2, and the image of voxel 3 in the scanned image is pixel 3. In FIG. 4a, the length of the rectangle used to denote a pixel is the width of the pixel, and the width of the rectangle used to denote a pixel is the gray scale of the pixel.

Figure 4B:
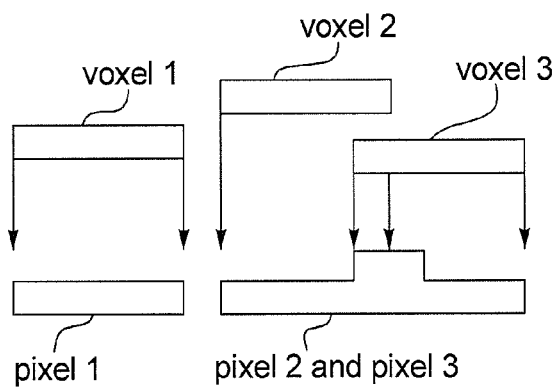
FIG. 4b is a schematic diagram of imaging by employing an EPI sequence in the prior art when the magnetic field is nonuniform.

FIG. 4b is a schematic diagram of imaging by employing an EPI sequence in the prior art when the magnetic field is not uniform. As shown in FIG. 4b, due to the nonuniformity of the magnetic field, the resonance frequency of voxels 1, 2 and 3 will change, and there are deviations between the actual positions of the excited voxels 1, 2 and 3 and their positions under the ideal conditions. For example, the excited voxels 1, 2 and 3 are not on the same slice, and, at the same time, when applying a phase encoding gradient, the phase differences between every two of voxels 1, 2 and 3 do not correspond to the ones under the ideal conditions, and, particularly, the phase difference between voxels 1 and 2 becomes larger, and the phase difference between voxels 2 and 3 becomes smaller, which is reflected in the scanned image in that pixels 2 and 3 partially overlap with each other, and in the overlapped region of pixels 2 and 3, the gray scale brightens (the gray value becomes large); and pixels 1 and 2 are not adjacent to each other, and in the region between pixels 1 and 2, the gray scale darkens (the gray value becomes small); thus causing distortions in the scanned image.

Figure 4C:
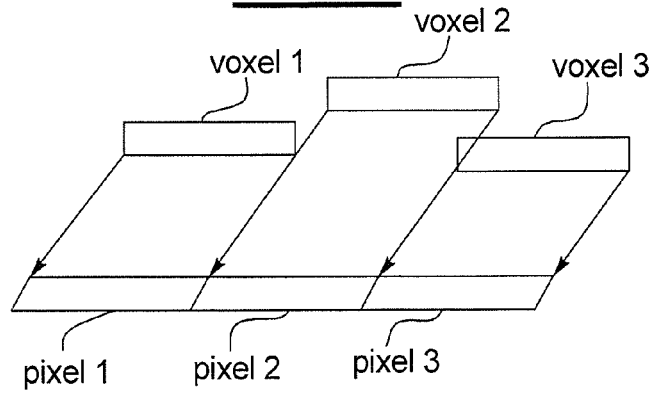
FIG. 4c is a schematic diagram of imaging by employing an EPI sequence provided by the present invention.

FIG. 4c is a schematic diagram of imaging by employing an EPI sequence provided by the present invention. As shown in FIG. 4c, an additional slice selection gradient in the SS direction is applied at the same time as the phase encoding gradient is applied, thus inclination of the projection angles of voxels 1, 2 and 3 in the phase encoding direction occurs and, when the imaging is carried out, the phase differences between every two of voxels 1, 2 and 3 correspond to the ones under the ideal conditions, thus avoiding distortions in the scanned image.

Step 102 involves collecting the scanning signals during the duration time of the readout gradients and carrying out the image reconstruction to obtain the scanned image.

In this embodiment, the scanning signals are echo signals.

For the methods for collecting the scanning signals and reconstructing the image, those in the prior art can be employed.

It needs to be pointed out that due to the inclination of the projection angle, there may be the problem of a blurred image at the edges, and, in practical applications, the effective bandwidth of the phase encoding gradient can be increased, and, in practical applications, the readout direction can also be divided into several parts and excited several times; and such readout segmentation of a EPI sequence is generally referred to as a segmented EPI sequence based on minor axis collections. It should be noted that the segmented EPI sequence based on the minor axis collections is the content of the prior art, but the improvement made in the present invention is to apply the slice selection gradients at the same time as applying the phase encoding gradients.

Moreover, FIG. 3a shows an EPI sequence on the basis of the gradient echo, and, in practical applications, the method provided by the present invention can also be used in other types of EPI sequences, for example, it can be used in an EPI sequence based on the spin echo.

Figure 3B:
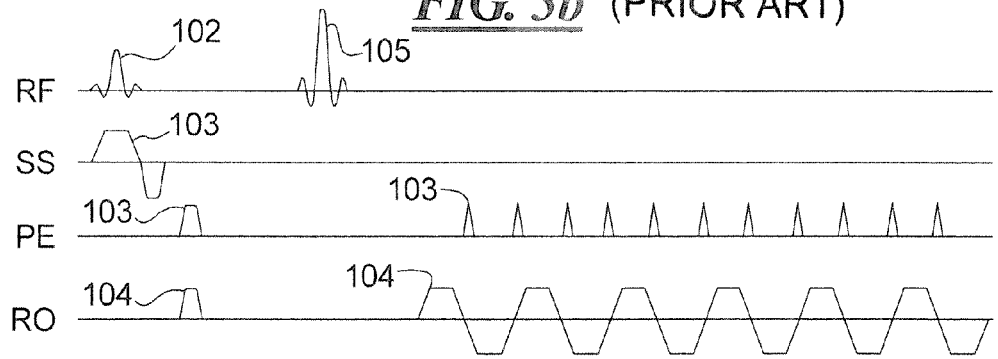
FIG. 3b is a schematic diagram of an EPI sequence on the basis of spin echo in the prior art.

FIG. 3b is a schematic diagram of an EPI sequence based on the spin echo in the prior art, and as shown in FIG. 3b, a slice selection gradient 101 is applied in the SS direction; at the same time, an RF pulse 102 at an angle of 90° with a specific frequency is used to selectively excite the voxels at a certain frequency; the excited voxels at a certain frequency are on one slice; then a phase encoding gradient 103 is applied in the PE direction; at the same time, a readout gradient 104 is applied in the RO direction; and after an RF pulse 105 at an angle of 180° is applied, the readout gradient 104 continues to alternate positively and negatively, an echo collection is carried out during each readout gradient 104, and a phase encoding gradient 103 is applied before starting each echo collection.

Figure 3C:
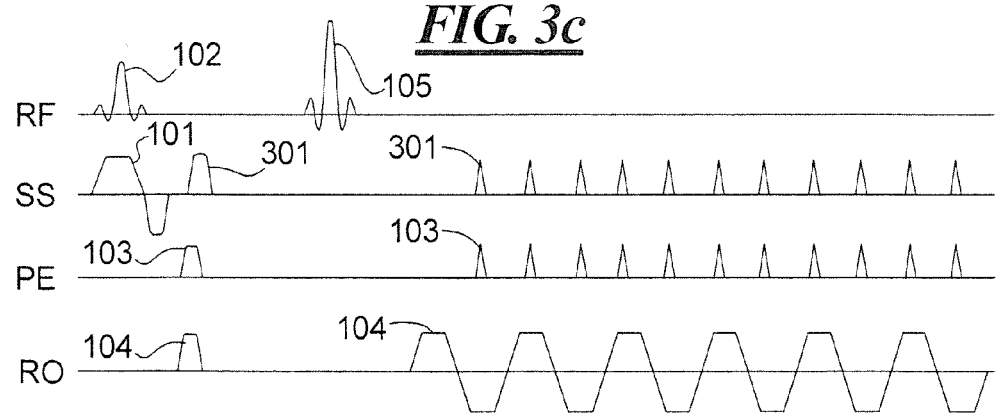
FIG. 3c is a schematic diagram of an EPI sequence on the basis of spin echo provided by the present invention.

FIG. 3c is a schematic diagram of an EPI sequence based on the spin echo provided by the present invention, and, as shown in FIG. 3c, the slice selection gradients 201 are applied at the same time as the phase encoding gradients 103 are applied.

Figure 5:
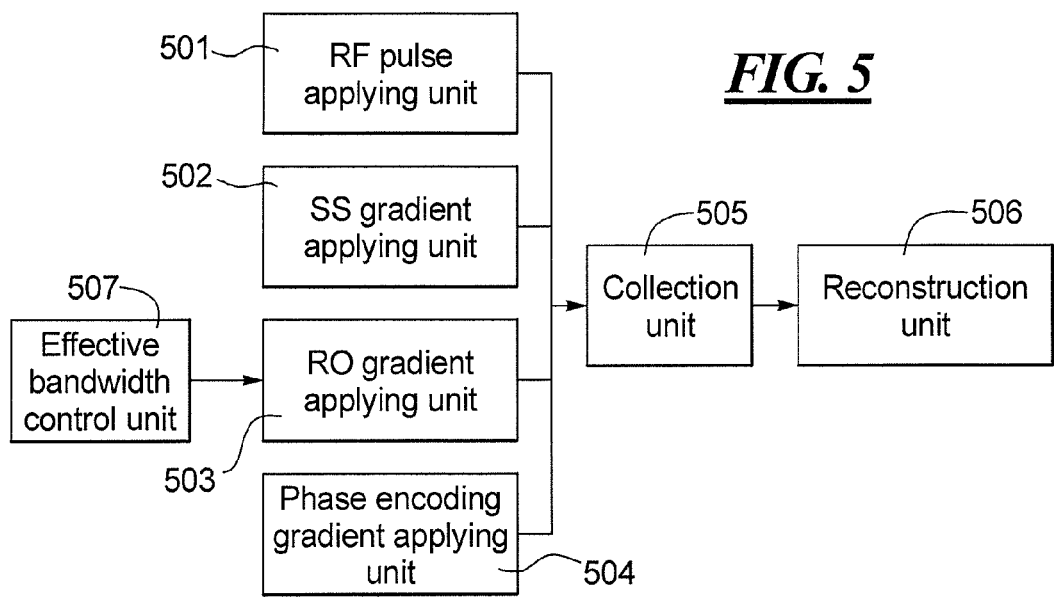
FIG. 5 schematically illustrates an apparatus for implementing the EPI sequence according to the invention.

On the basis of the abovementioned method for echo planar imaging, FIG. 5 is a structural diagram of a system for echo planar imaging of an embodiment of the present invention. As shown in FIG. 5, the system comprises: a radiofrequency pulse applying unit 501, a slice selection gradient applying unit 502, a readout gradient applying unit 503, a phase encoding gradient applying unit 504, a collecting unit 505, and a reconstruction unit 506.

In this case, the radiofrequency pulse applying unit 501 applies a radiofrequency pulse; the readout gradient applying unit 503 applies continuous readout gradients alternating between positive and negative; the phase encoding gradient applying unit 504 applies a phase encoding gradient before starting each readout gradient; the slice selection gradient applying unit 502 applies a slice selection gradient at the same time as a phase encoding gradient is applied; the collecting unit 505 collects scanning signals during the duration time of the readout gradients; and the reconstruction unit 506 carries out image reconstruction on the basis of the scanning signals, so as to obtain a scanned image.

The system further comprises: an effective bandwidth control unit 507 for increasing the effective bandwidth of a phase encoding gradient according to the predetermined requirements.

For the particular description of an embodiment of a system for echo planar imaging provided by the present invention, please refer to the corresponding description of the embodiment of the method shown in FIG. 2, and it will not be described further redundantly.

Figure 6A:
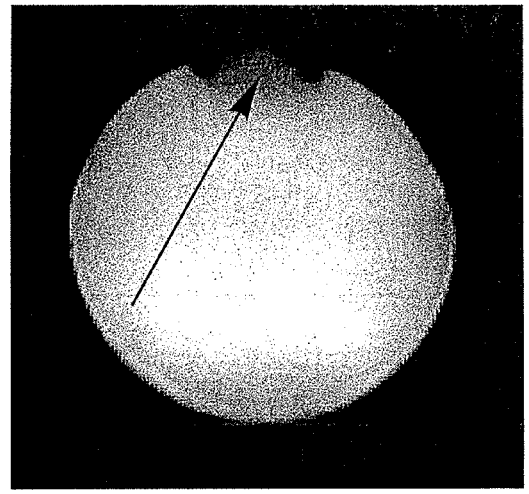
FIG. 6a is a diagram of an experimental result by employing an EPI sequence in the prior art.
Figure 6B:
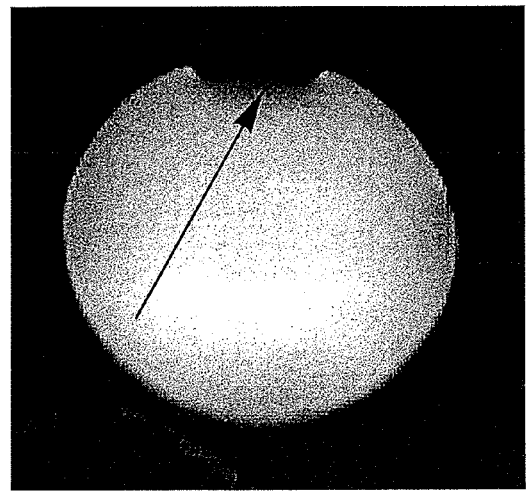
FIG. 6b is a diagram of an experimental result by employing an EPI sequence provided by the present invention.

By employing the method and system provided in the present invention, distortions in a scanned image can be avoided. FIG. 6a is a diagram of an experimental result by employing an EPI sequence in the prior art, the scanned object is a water phantom, the region pointed by the arrow is the interface of the solution and air in the water phantom, and because the magnetic susceptibility of these is different, there are distortions on the interface between them in the image. FIG. 6b is a diagram of an experimental result by employing an EPI sequence provided in the present invention, and by comparing FIG. 6a with FIG. 6b, it can be seen that by employing the method and system provided in the present invention distortions in a scanned image can be avoided.

It can be seen that on the basis of the abovementioned method and system of echo planar imaging, an additional slice selection gradient is applied at the same time as a phase encoding gradient is applied, thus the projection angles of the voxels in the phase encoding direction are made to incline, the problem that errors appear in the phase differences of the voxels due to the nonuniformity of the magnetic field is overcome and distortions in a scanned image are avoided.

Although modifications and changes may be suggested by those skilled in the art, it is the intention of the inventor to embody within the patent warranted hereon all changes and modifications as reasonably and properly come within the scope of his contribution to the art.

I claim as my invention:

1. A method of echo planar imaging comprising the steps of:

operating a magnetic resonance data acquisition unit with an echo planar imaging sequence having an excitation phase followed by a readout phase;

in said excitation phase, applying a radiofrequency pulse and a slice selection gradient to a subject and thereafter, in said readout phase, applying continuous readout gradients to the subject alternating between positive and negative and applying a phase encoding gradient to the subject in the readout phase before starting each readout gradient in the readout phase;

applying a slice selection gradient to the subject in the readout phase at the same time as applying a phase encoding gradient during said readout phase;

collecting echo planar scanning signals from the subject during the duration of the readout gradients; and in a processor, reconstructing a planar image of the subject from said echo planar scanning signals in order to obtain a scanned planar image of the subject, and making the planar image available at an output of the processor in electronic form, as a data file.

2. The method as claimed in claim 1, wherein an amplitude of the slice selection gradient, that is applied at the same time as applying the phase encoding gradient, is equal to an amplitude of the phase encoding gradient.

3. The method as claimed in claim 1, comprising increasing the effective bandwidth of the phase encoding gradient.

4. A magnetic resonance (MR) system configured for echo planar imaging, comprising:

an MR data acquisition unit comprising a radio frequency (RF) unit and a gradient unit;

a control unit configured to operate said MR data acquisition unit, with an examination subject located therein, according to an echo planar imaging sequence having an excitation phase followed by a readout phase;

said control unit being configured to operate said RF unit in said excitation phase in order to radiate an RF pulse, and in order to operate said gradient unit in said excitation phase in order to generate a slice selection gradient and thereafter, in said readout phase, in order to operate said gradient unit in order to generate continuous readout gradients that alternate between positive gradients and negative gradients and in order to generate a phase encoding gradient in said readout phase before starting each readout gradient in said readout phase;

said control unit being configured to operate said gradient unit, in said readout phase, in order to generate a slice selection gradient in said readout phase at the same time as applying a phase encoding gradient during said readout phase;

said control unit being configured to operate said RF unit in order to detect echo planar signals from the examination subject during a duration of said readout gradients; and a processor supplied with said echo planar signals configured to reconstruct a planar image of the subject from said echo planar signals, and configured to make said planar image of the subject available at an output of the processor in electronic form, as a data file.

5. The system as claimed in claim 4 wherein said control unit is configured to operate said gradient system in order to increase an effective bandwidth of the phase encoding gradient.

* * * * *